United States Patent

Lin et al.

[11] Patent Number: 5,966,604
[45] Date of Patent: Oct. 12, 1999

[54] METHOD OF MANUFACTURING MOS COMPONENTS HAVING LIGHTLY DOPED DRAIN STRUCTURES

[75] Inventors: Han Lin, Hsinchu; Jengping Lin, Taoyuan Hsien; Sun-Chieh Chien, Hsinchu, all of Taiwan

[73] Assignee: United Microelectronics Corp., Taiwan

[21] Appl. No.: 08/890,363

[22] Filed: Jul. 9, 1997

[30] Foreign Application Priority Data

Mar. 24, 1997 [TW] Taiwan ................................. 8-6103714

[51] Int. Cl.⁶ .................................................. H01L 21/336
[52] U.S. Cl. .......................... 438/279; 438/302; 438/525
[58] Field of Search ................................. 438/279, 302, 438/525

[56] References Cited

U.S. PATENT DOCUMENTS

| 5,308,780 | 5/1994 | Chou et al. |
|---|---|---|
| 5,355,006 | 10/1994 | Iguchi ..................................... 257/296 |
| 5,426,063 | 6/1995 | Kaneko et al. . |
| 5,736,416 | 4/1998 | Johansson . |
| 5,849,615 | 12/1998 | Ahmad et al. .......................... 438/231 |
| 5,874,329 | 2/1999 | Neary et al. ............................ 438/203 |
| 5,882,961 | 3/1999 | Klingbeil, Jr. et al. ................ 438/180 |

Primary Examiner—Richard Booth
Attorney, Agent, or Firm—Finnegan, Henderson, Farabow, Garrett & Dunner, L.L.P.

[57] ABSTRACT

The present invention relates to a method of manufacturing MOS components having lightly doped drains wherein the implanting type ion used is different than that used in the formation of the source/drain regions. The present invention also includes the use of a tilt implantation angle accompanied by substrate rotation during the implantation process to form lightly doped drain structures on two sides of the source/drain regions. The mask is the same for the formation of the source/drain regions as that for the formation of the lightly doped drain regions. The method of manufacturing MOS components having lightly doped drains according to this invention has fewer manufacturing processes for the formation of spacers than the conventional methods. Moreover, the reduction in spacer production results in an increased contact surface area for subsequent contact window formation, thereby lowering contact resistance.

9 Claims, 5 Drawing Sheets

METHOD OF MANUFACTURING MOS COMPONENTS HAVING LIGHTLY DOPED DRAIN STRUCTURES

BACKGROUND OF THE INVENTION

1. Field of the Invention

The present invention relates to a method of manufacturing metal-oxide-semiconductor (MOS) components, and more particularly to a method of manufacturing MOS components having a lightly doped drain structure formed by using different ionic types in the implementation process.

2. Description of Related Art

MOS components are becoming smaller and smaller in order to increase the level of integration and speed of operation, therefore, the channel length of such components is being correspondingly reduced. As a consequence of the shortening of the channel length of a MOS transistor, detrimental short channel and hot electron effects have become dominant. To alleviate the problems caused by a reduction in channel length, it is common practice to add a group of impurity diffusion regions with dopant concentration level less than that of the original source/drain regions in areas surrounding the channel inside the original source/drain regions. This structural layout is known as a lightly doped drain (LDD).

FIGS. 1A through 1D show the manufacturing of an MOS component having a lightly doped drain structure. Referring to FIG. 1A, a substrate 10, such as a P-type silicon substrate, is provided having a plurality of gates 11 and field oxide layers 12 defined over it. Using the gates 11 and the field oxide layers 12 as masks, N-type ions, such as phosphorus ions, having a moderate concentration of about $10^{13}/cm^2$ are implanted into the substrate 10 forming lightly doped drain regions 13.

Referring next to FIG. 1B, spacers 14 are formed on the sidewalls of the gates 11. The spacers 14 can be made from material such as silicon dioxide or silicon nitride. The spacers 14, beside serving as partitions for separating adjacent gates 11, further function as masks with gates 11 when the source/drain regions are undergoing heavy doping.

Referring next to FIG. 1C, using the gates 11, the spacers 14, and the field oxide layers 12 as masks, N-type ions such as arsenic ions, having a concentration level of about $10^{15}/cm^2$ and deep implantation depth levels, are implanted into the substrate 10 forming the source drain regions 15.

Thereafter, referring to FIG. 1D, a planarized insulating layer 16 made from material such as borophosphosilicate glass (BPSG) is formed over the surfaces of the aforementioned layers. Next, a pattern is defined on the insulating layer 16 thereby forming contact window openings 17 that expose the source/drain regions 15. Finally, a conducting layer 18, such as an aluminum layer, is formed in the contact window openings 17 to form a plurality of contact windows 18.

In the above described conventional manufacturing process for forming a lightly doped drain structures of an MOS component, the spacers 14 are required to function as masks in the process of doping the source/drain regions 15 after the formation of the lightly doped drain regions 13. Moreover, because of the presence of spacers 14 on two sidewalls of the gate 11 and the thickness of the insulating layer 16, the available area for the contact window openings 17 is reduced, thereby lowering the contact surface area with the source/drain regions 15. This reduction in contact surface area results in increased resistance and a lowering the level of integration between the source/drain regions 15 and the conducting layer 18.

SUMMARY OF THE INVENTION

The objects of the invention are to provide a method of manufacturing MOS components having a lightly doped drain structure by using different types of ions in the conveying process while using the same mask to form the source/drain and lightly doped drain regions.

Another object of the present invention is to provide a method of manufacturing MOS components having lightly doped drain structures which eliminate the need for producing spacers for forming the lightly doped drain structure. Thereby benefiting the fabrication of submicron integrated circuits by increasing the surface area of the contact window while lowering the contact resistance under the same level of integration.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method of manufacturing MOS components having lightly doped drains comprising: (a) providing a first type substrate having a plurality of gates and an insulating layer over the gates, (b) using the insulating layer and the gates as masks, doping the substrate with second type ions and forming a plurality of source/drain regions, (c) using the insulating layer and the gates as masks, doping the source/drain regions with first type ions at a tilt angle, while simultaneously rotating the substrate to form a plurality of lightly doped drain regions on two sides and adjacent to a gate inside the source/drain regions (d) forming a dielectric layer over the substrate followed by defining a pattern on the dielectric layer, the pattern forming a plurality of spacers on sides of adjacent gates, and exposing source/drain regions for the formation of contact window openings (e) forming a conducting layer over the substrate such that the conducting layer is electrically coupled with the exposed source/drain regions, and (f) defining a pattern on the conducting layer for forming contact windows to complete the fabrication of lightly doped drains in the MOS components.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principals of the invention. In the drawings.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 1A:
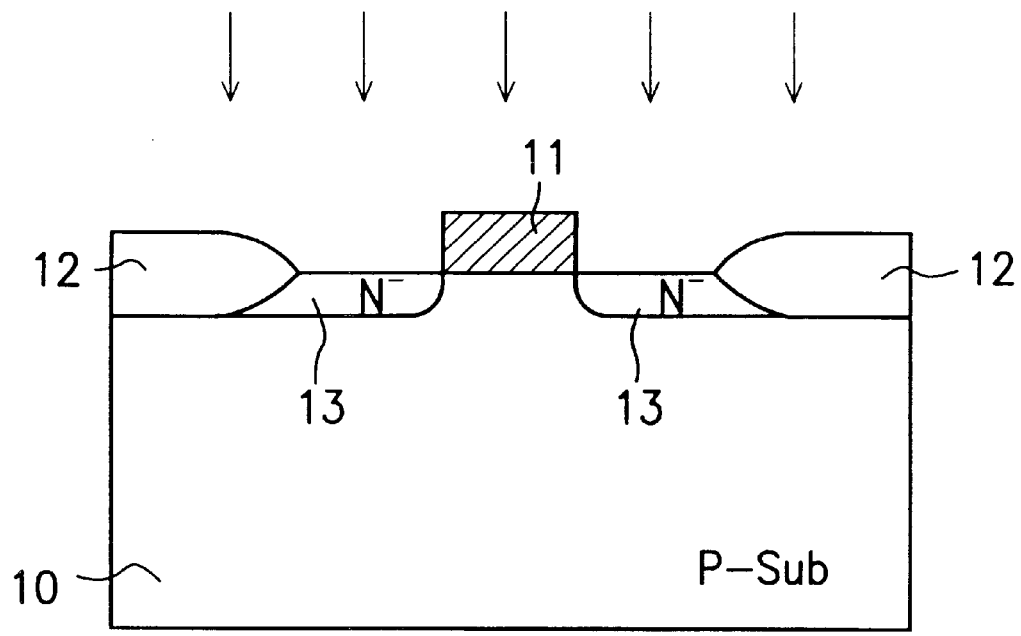
FIGS. 1A through 1D are a series of cross-sectional views showing the conventional manufacturing of a lightly doped drain structure in an MOS component.
Figure 1B:
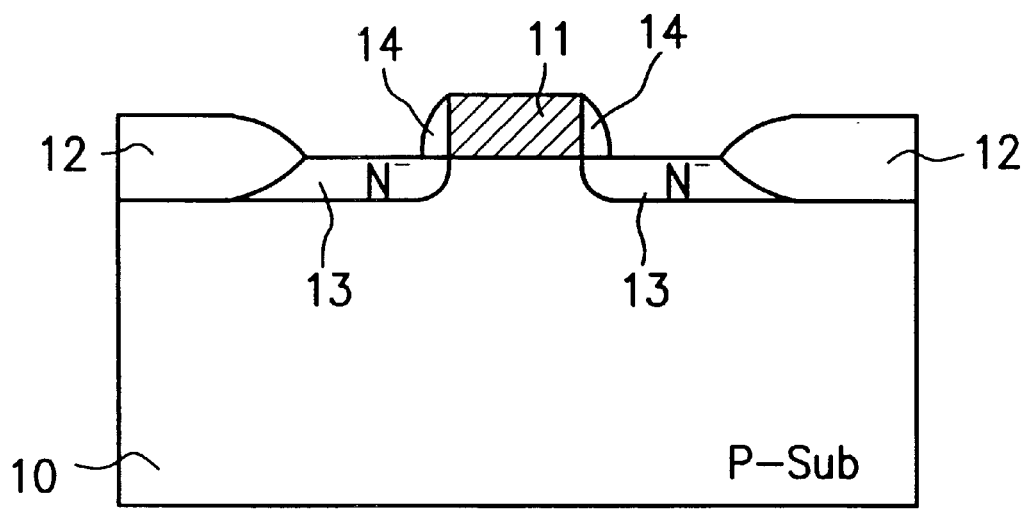
Figure 1C:
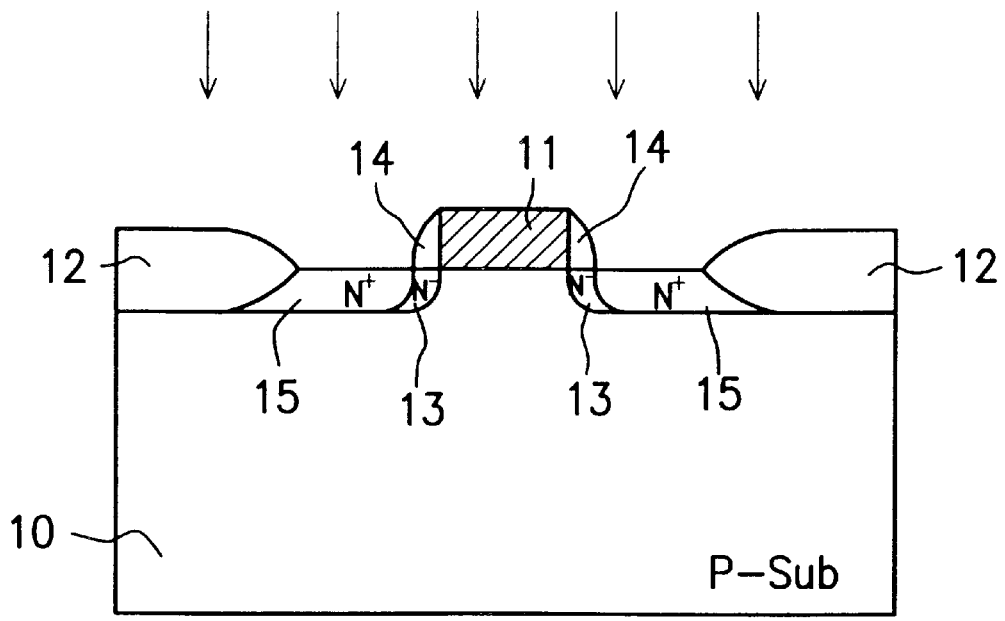
Figure 1D:
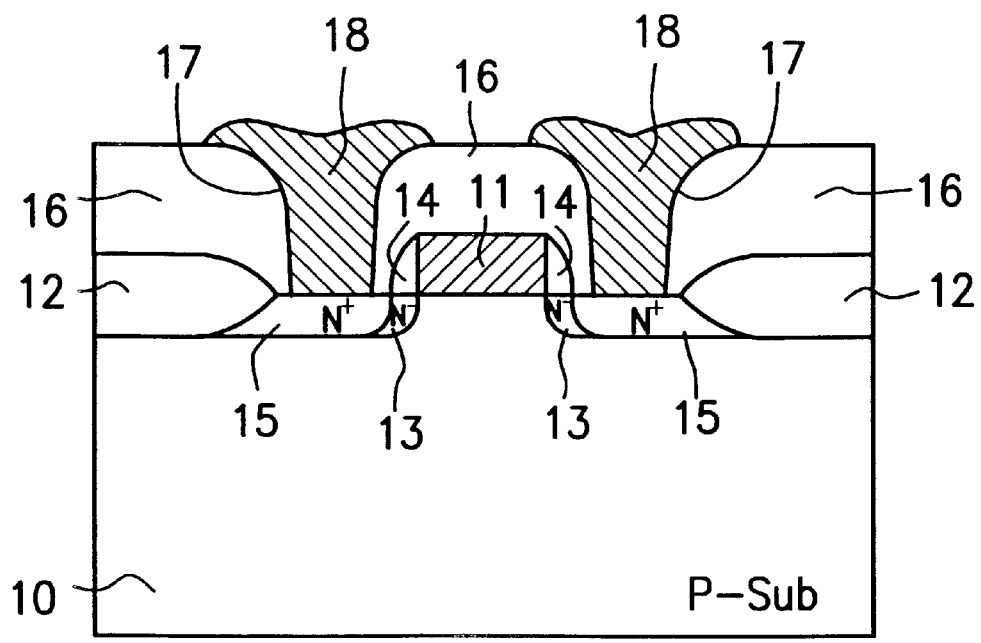
Figure 2A:
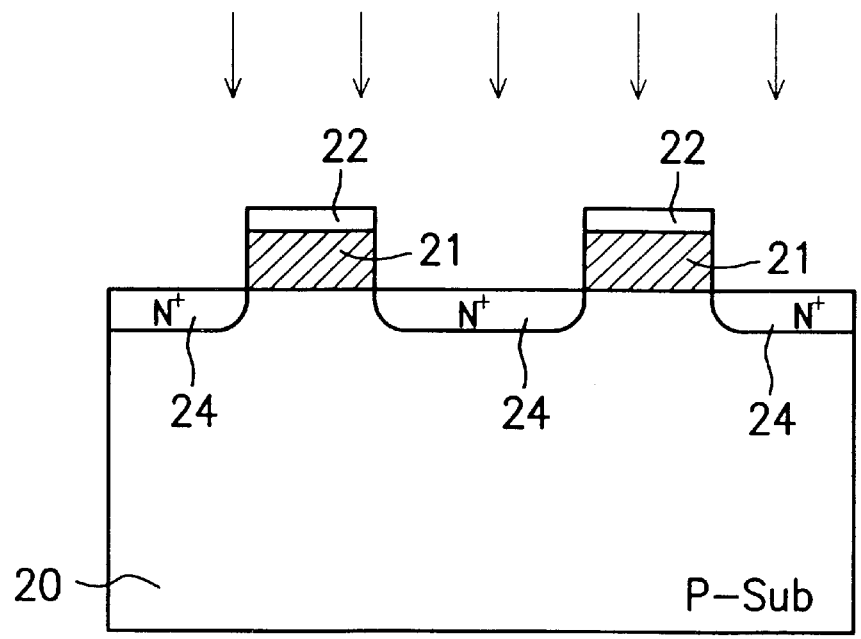
FIGS. 2A through 2F are a series of cross-sectional views showing the manufacturing of a lightly doped drain structure in an MOS component according to one preferred embodiment of this invention.

FIGS. 2A through 2F are a series of cross-sectional views showing the manufacturing of a lightly doped drain structure in an MOS component according to the preferred embodiment of this invention. Referring to FIG. 2A, a first type substrate 20, such as a P-type silicon substrate, includes a plurality of gates 21 and an insulating layer 22, such as a silicon dioxide or a silicon nitride layer, formed above the gates 21. Using the gates 21 and insulating layer 22 as masks, second type ions, such as N-type ions, are heavily doped onto the substrate 20 thereby forming source/drain regions 24.

Figure 2B:
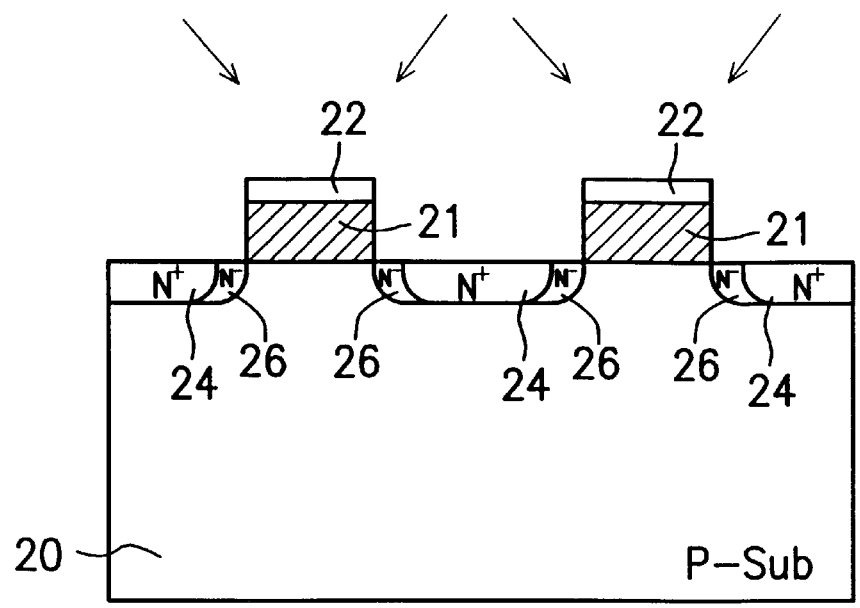

Referring next to FIG. 2B, the subsequent step of fabrication of the lightly doped drain regions is carried out. Similarly, using the gates 21 and the insulating layer 22 as masks, first type ions, such as P-type ions, having a lighter concentration than the second type ions are doped at a tilt angle toward the source/drain regions 24 while the substrate is rotating. This process results in lightly doped drain regions 26 formed on two sides and adjacent to the gate region inside the source/drain regions 24. An important aspect of this method lies in the utilization of different properties between the first type ions and the second type ions, such that their concentrations can be adjusted to neutralize each other. Hence, when first type ions having a lighter concentration are doped to the source/drain regions 24 having heavily doped second type ions, the second type ions on two sides of the source/drain regions 24 will be neutralized by the first type ions. This neutralization results in a lowering of the overall concentration in the area, thereby forming lightly doped drains 26.

Figure 2C:
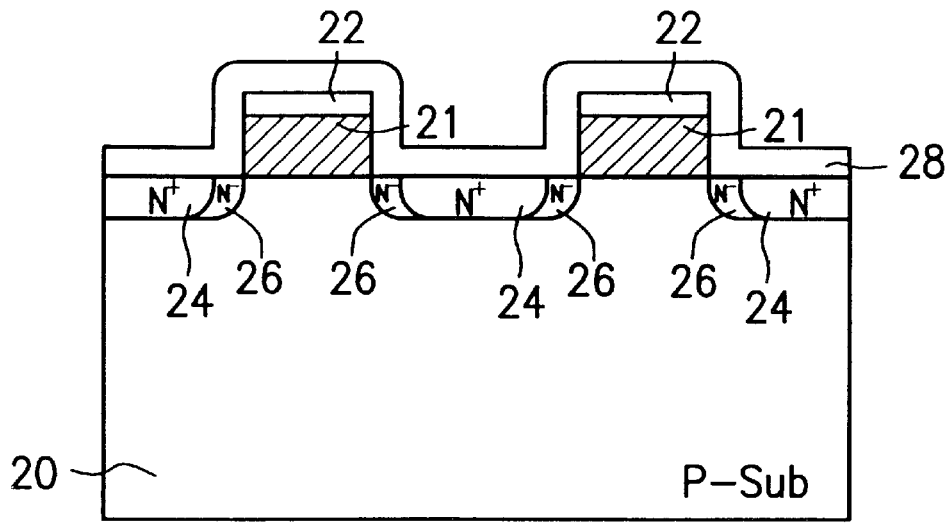
Figure 2D:
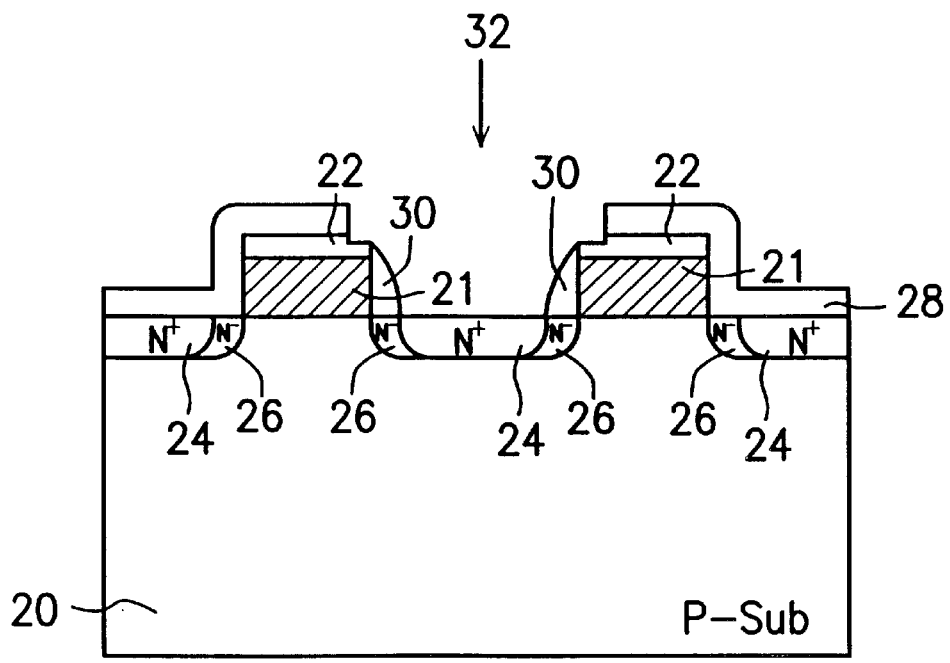

Subsequently, FIGS. 2C and 2D depict the fabrication of contact windows. First, a dielectric layer 28 is formed over the surfaces of the aforementioned layers, such as a silicon nitride or silicon oxide layer. Then, using photolithographic and anisotropic etching processes, a pattern is defined on the dielectric layer 28 such that part of the insulating layer 22 may be removed while spacers 30 are formed on two sidewalls of a gate 21 exposing the source/drain regions 24 where contact is desired. This etching process forms a contact window opening 32 as shown in FIG. 2D. Since there is only one spacer 30 on each side of the gate 21, the area for contact with the source/drain regions 24 will be increased.

Figure 2E:
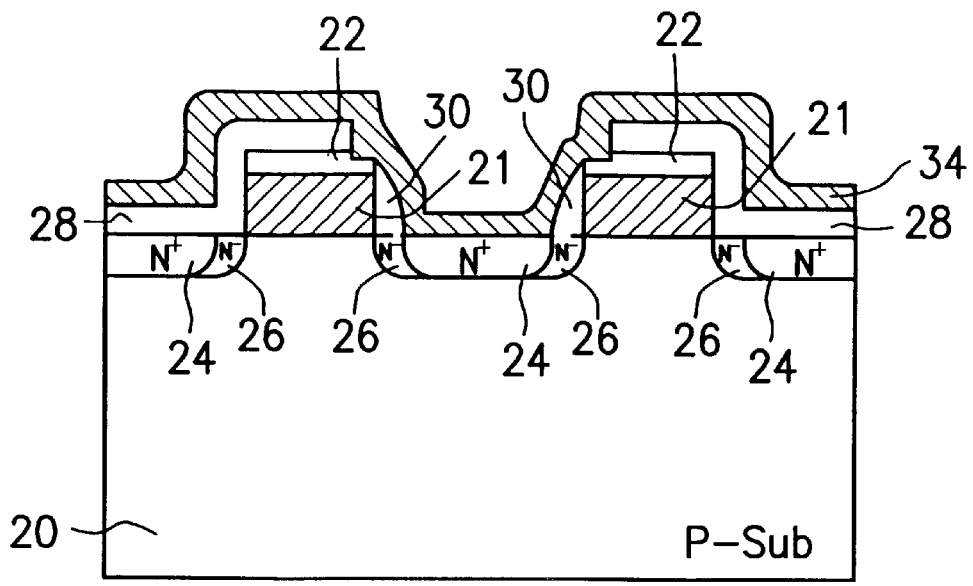
Figure 2F:
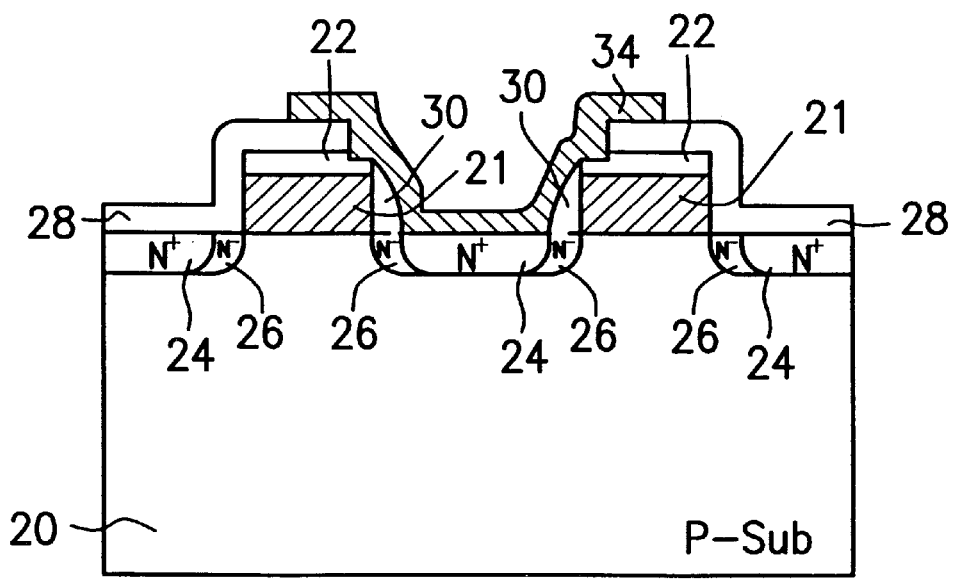

Finally, referring to FIG. 2E, a conducting layer 34, such as a heavily doped polysilicon layer, is formed over the surfaces of the various layers such that the conducting layer 34 is electrically coupled with the exposed source/drain regions 24. Thereafter, a pattern as shown in FIG. 2F is defined on the conducting layer 34 forming contact windows. This completes the manufacturing process for MOS components having a lightly doped drain structure according to the preferred embodiment of this invention. Subsequent back-end processing operations are not directly related to this invention and description thereof will be omitted.

In the above embodiment, the first type ions may be a P-type while the second type ions may be an N-type. However, within the spirit of this invention, the first type can be an N-type while the second type can be a P-type.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing method for MOS components having lightly doped drains comprising:

(a) providing a first conductivity type substrate having a plurality of gates and an insulating layer over the gates;

(b) using the insulating layer and the gates as masks, doping the substrate with second conductivity type ions and forming a plurality of source/drain regions;

(c) using the insulating layer and the gates as masks, doping the source/drain regions with first conductivity type ions at a tilt angle, while simultaneously rotating the substrate accordingly to form a plurality of lightly doped drain regions on opposite sides of the source/drain regions such that each of the lightly doped drain regions is adjacent to a different gate inside the source/drain regions;

(d) forming a dielectric layer over the substrate and defining a pattern on the dielectric layer to form a plurality of spacers on two sides of some of the gates, and exposing some of the source/drain regions to form contact window openings;

(e) forming a conducting layer over the substrate such that the conducting layer is electrically coupled with some of the exposed source/drain regions; and (f) defining a pattern on the conducting layer and forming contact windows to complete the fabrication of the MOS components.

2. A manufacturing method according to claim 1, wherein the first conductivity type is a P-type and the second conductivity type is an N-type.

3. A manufacturing method according to claim 1, wherein the first conductivity type is an N-type, the second conductivity type is a P-type.

4. A method of manufacturing according to claim 1, wherein the insulating layer of step (a) is a silicon oxide layer.

5. A method of manufacturing according to claim 1, wherein the insulating layer of step (a) is silicon nitride layer.

6. A method of manufacturing according to claim 1, wherein the degree of concentration for the first type ions is lower than that of the second type ions.

7. A method of manufacturing according to claim 1, wherein the dielectric layer of step (d) is a silicon nitride layer.

8. A method of manufacturing according to claim 1, wherein the dielectric layer of step (d) is a silicon oxide layer.

9. A method of manufacturing according to claim 1, wherein the conducting layer of step (e) is a high impurity concentration polysilicon layer.

* * * * *